United States Patent [19]
Socha

[11] Patent Number: 5,957,364
[45] Date of Patent: Sep. 28, 1999

[54] INTEGRATED SOLDER PREFORM ARRAY HAVING A TIN OUTER COATING

[75] Inventor: Paul A. Socha, Whitesboro, N.Y.

[73] Assignee: Indium Corporation of America, Utica, N.Y.

[21] Appl. No.: 08/661,179

[22] Filed: Jun. 10, 1996

[51] Int. Cl.[6] .............................. B23K 35/14; B23K 35/22
[52] U.S. Cl. ........................................ 228/56.3; 228/214
[58] Field of Search ...................... 228/56.3, 56.3 FOR, 228/214

[56] References Cited

U.S. PATENT DOCUMENTS

| Re. 30,348 | 7/1980 | Hascoe | 228/56.3 |
|---|---|---|---|
| 3,169,048 | 2/1965 | McGinn | 228/56.3 |
| 4,901,908 | 2/1990 | Negura et al. | 228/56.3 |
| 5,086,966 | 2/1992 | Melton et al. | 228/56.3 |
| 5,242,097 | 9/1993 | Socha | 228/56.3 |

*Primary Examiner*—Patrick Ryan
*Assistant Examiner*—Jeffrey T. Knapp
*Attorney, Agent, or Firm*—Wall Marjama & Bilinski

[57] ABSTRACT

An integrated solder preform array is composed of a metal or metal alloy suitable for use in a soldering or bonding process. The preform includes a series of discrete solder islands disposed in a desired matrix. Each island contains a hole for receiving a pin, and bridging strands for joining each of said islands in a matrix. The bridging strands are formed of the same solder material as the islands, with the solder preform containing a substantially uniform coating of tin over its entire outer surface for the purpose of improving solder wetting and therefore elimination of unwanted shorting of circuits and other electrical components being soldered.

1 Claim, 1 Drawing Sheet

INTEGRATED SOLDER PREFORM ARRAY HAVING A TIN OUTER COATING

BACKGROUND OF THE INVENTION

The invention relates to solder preforms for use in joining one object to another, and more specifically to an integrated preform array (preform) used for joining electronic components to connectors, circuit board terminals and other elements.

U.S. Pat. No. 5,242,097 teaches that a solder preform once applied to terminals or pin components to be soldered, will not become easily dislodged when the assembly is handled prior to the soldering operation. More specifically, U.S. Pat. No. 5,242,097 provides an integrated solder preform array in which individual bridging strands of solder cojoin solder islands positively, and reliably separate in the midregion of the strands so that the separated halves retract to adjacent solder islands in a positive and uniform fashion.

The preforms of the type taught by U.S. Pat. No. 5,242,097 typically are made of an alloy which, when exposed for any significant period of time to the atmosphere, tend to form surface oxides. The formation of these surface oxides sometimes creates problems by impeding the proper wetting of the solder, in-turn preventing the strands connecting the integrated preform array islands from efficiently separating and retracting to the preform islands. When this occurs, an electrical short can be caused due to the unwanted electrical contact between adjacent individual pins.

It can therefore be seen that there is a need for an improved integrated solder preform array which provides for ease of wetting during the soldering operation, and for a clean break of the strands connecting each solder preform island. Such a preform would eliminate the problem of unwanted shorting of circuit boards or other electrical components being soldered. It is, therefore, an object of the present invention to overcome the problems noted above.

SUMMARY OF THE INVENTION

The above and other objects of the present invention are accomplished by providing a thin tin coating or film over the solder preform after the final manufacturing step in making the preform. It has been found that a thin tin coating over the solder preform significantly reduces the formation of unwanted oxides. These oxides have been found to prevent or make wetting during the solder operation difficult or inconsistent from preform to preform.

The formation of the tin coating on the solder preform may be carried out by any convenient method. The preferred method involves immersion coating the preform array in a bath having a suitable source of a tin component. Other methods of coating the surface with tin include electrolytic deposition, sputtering, etc.

DETAILED DESCRIPTION OF THE INVENTION

Figure 1:
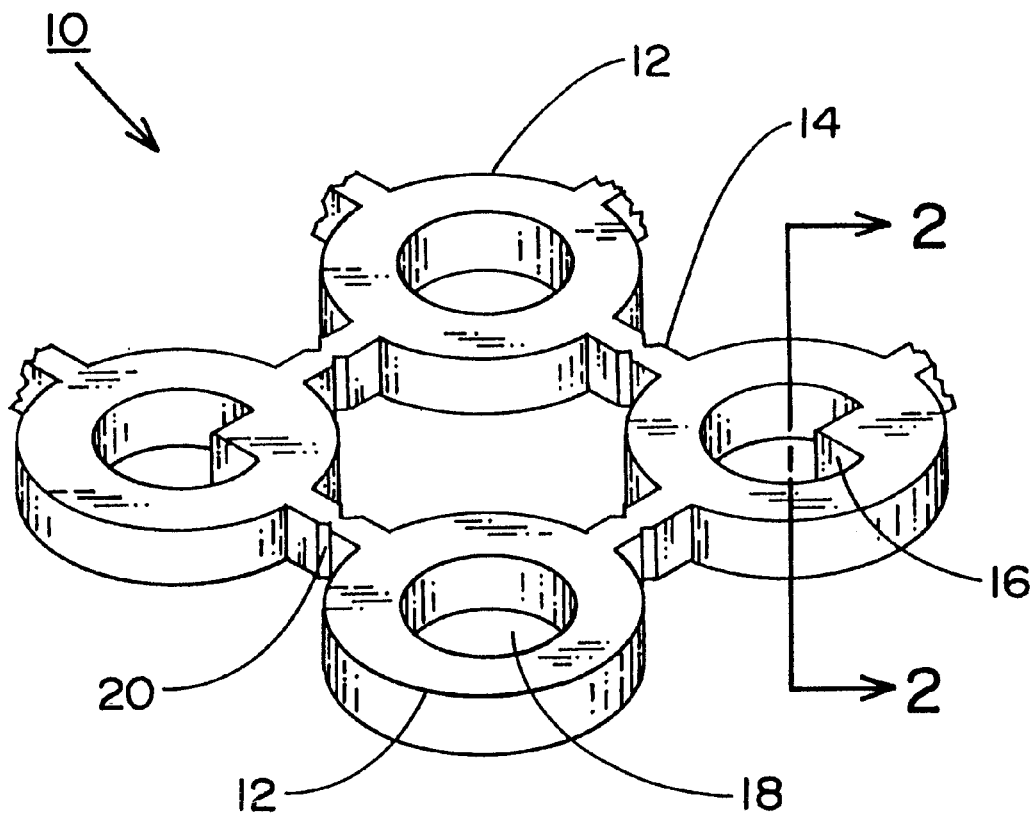
FIG. 1 is an enlarged fragmentary detail perspective of a preform of the present invention.

Referring initially to FIG. 1, there is shown an integrated preform array 10 which contains a plurality of washer shaped solder islands 12, which in one embodiment, would be equal in number to the number of pins in a pin array more fully described in U.S. Pat. No. 5,242,097 which is incorporated herein by reference. Certain solder islands 12 may be equipped with a tab 16 that extends radially into the hole area 18 of the island so that the tabs will frictionally engage pins that are passed into the selected holes. The washer shaped islands are joined together by bridging strands 14 which are optionally notched at 20 to provide a reduced solder area at the midregion of each strand 14.

Figure 2:
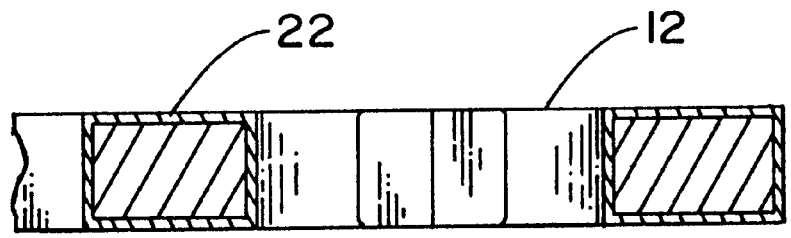
FIG. 2 is a sectional view along line 2—2 of the preform of FIG. 1.

As will be more fully described herein, and as illustrated in FIG. 2, the entire preform 10 contains a thin tin coating or film 22 over its entire outer surface.

A preferred method of applying the tin coating to the solder perform is by immersion coating in a tin containing bath formulation. A suitable bath formulation for use in the present invention is set forth below. In the table, the concentration of the five components are listed with their quantities required in a liter of deionized water.

| IMMERSION TIN BATH | |
|---|---|
| Stannous Chloride | 20 g/l |
| Thiourea | 75 g/l |
| Concentrated hydrochloric acid | 50 ml/l |
| Sodium Hyposphosite | 16 g/l |
| Wetting Agent Triton X-100* | 0.5 ml/l |

*Commercially available from J. T. Baker Inc. of Phillipsburg, New Jersey

Typically a tin outer coating of about 0.75 to 1.30 microns has been found to be satisfactory. A preferred coating of about 1.20 microns has been found to be particularly suitable.

The bath is generally maintained in a temperature range of about 80 to 150° F. and the preform immersed in the bath for about 5 to 20 minutes. The solder preforms, and method of manufacturing the preforms is specifically set forth in applicant's U.S. Pat. No. 5,242,097 which is incorporated herein by reference.

The present invention is applicable to any metal or metal alloy suitable for use in soldering or bonding. Typical metals and alloys include 63% Sn, 37% Pb; 62% Sn, 36% Pb, 2% Ag; 96.5% Sn, 3.5% Ag; and 60% In, 40% Pb; all in weight percent.

While this invention has been explained with reference to the structure and method described herein, it is not confined to the details set forth in this application and is intended to cover any modification or changes that may come within the scope following the claims.

What is claimed is:

1. An integrated preform array comprising a metal alloy suitable for use in a soldering or bonding process including a series of discrete solder islands disposed in a desired matrix, a plurality of said islands containing a hole for receiving a pin therein, bridging strands for joining each of said islands in a matrix, with said bridging strands being formed of the same solder material as said island, with said solder preform containing a substantially uniform coating of tin over its entire surface with said coating being in the range of about 0.75 to 1.30 microns in thickness.

* * * * *